US 6,661,359 B2

(12) United States Patent
Hernden et al.

(10) Patent No.: US 6,661,359 B2
(45) Date of Patent: Dec. 9, 2003

(54) DEVICE AND METHOD FOR GENERATING SYNCHRONOUS NUMERIC SIGNALS

(75) Inventors: Charles G. Hernden, Boulder, CO (US); Fabio Pasolini, San Martino Siccomario (IT)

(73) Assignees: STMicroelectronics, Inc., Carrollton, TX (US); STMicroelectronics, S.r.l. (IT)

(*) Notice: Subject to any disclaimer, the term of this patent is extended or adjusted under 35 U.S.C. 154(b) by 167 days.

(21) Appl. No.: 10/032,862

(22) Filed: Oct. 25, 2001

(65) Prior Publication Data

US 2002/0087217 A1 Jul. 4, 2002

(30) Foreign Application Priority Data

Nov. 20, 2000 (EP) .......................................... 00830775

(51) Int. Cl.[7] ................................................ H03M 1/48
(52) U.S. Cl. .................... 341/111; 341/110; 341/112; 341/118; 341/120; 341/129; 341/143; 341/155; 360/46; 360/65; 360/77.02; 360/78.04; 331/1 A; 331/16; 331/25
(58) Field of Search ................................ 341/110, 111, 341/112, 155, 118, 120, 122, 123, 143, 116; 331/1 A, 16, 25; 360/46, 65, 77.02, 78.04

(56) References Cited

U.S. PATENT DOCUMENTS

| | | | |
|---|---|---|---|
| 4,472,785 A | 9/1984 | Kasuga | 364/718 |
| 4,746,899 A | 5/1988 | Swanson et al. | 340/347 AD |
| 4,902,979 A * | 2/1990 | Puckette, IV | 329/343 |
| 4,965,531 A * | 10/1990 | Riley | 331/1 A |
| 5,087,829 A | 2/1992 | Ishibashi et al. | 307/269 |
| 5,387,913 A * | 2/1995 | Park et al. | 341/155 |
| 5,625,359 A * | 4/1997 | Wilson et al. | 341/143 |
| 5,767,720 A | 6/1998 | Osera et al. | 327/295 |
| 6,057,791 A | 5/2000 | Knapp | 341/122 |
| 6,147,632 A * | 11/2000 | Iwasaki | 341/123 |
| 6,215,423 B1 * | 4/2001 | May et al. | 341/61 |
| 6,269,065 B1 * | 7/2001 | Ogura et al. | 369/94 |
| 6,445,522 B1 * | 9/2002 | Tsunoda et al. | 360/46 |
| 6,580,383 B1 * | 6/2003 | Devendorf et al. | 341/143 |

FOREIGN PATENT DOCUMENTS

| | | |
|---|---|---|
| EP | 0 384 595 A2 | 8/1990 |
| EP | 0 419 823 A1 | 4/1991 |
| EP | 0 602 718 A2 | 6/1994 |
| EP | 0798698 A2 | 10/1997 |
| WO | WO 00/43993 | 7/2000 |

OTHER PUBLICATIONS

Abramovitch, D.Y., "Rejecting Rotational Disturbances on Small Disk Drives Using Rotational Accelerometers", *Control Eng. Practice*, vol. 5, No. 11, Nov. 1997, pp. 1517–1524.

Jinzenji, Akihide, et al., "Acceleration Feedforward Control against Rotational Disturbance in Hard Disk Drives", *IEEE*, Mar. 2000, pp. TA6–01–TA6–02.

Lemkin, M., et al., "A Three–Axis Micromachined Accelerometer with a CMOS Position–Sense Interface and Digital Offset–Trim Electronics," *IEEE*, vol. 34, No. 4, Apr., 1999, pp. 456–468.

* cited by examiner

Primary Examiner—Michael Tokar
Assistant Examiner—Linh V Nguyen
(74) Attorney, Agent, or Firm—David V. Carlson; Lisa K. Jorgenson (57) ABSTRACT

A device for generating synchronous numeric signals, including a reference generating device supplying a reference signal and a first timing signal, both having a reference frequency; and a timed generating device supplying a synchronized signal having the reference frequency. The device further includes a synchronization stage generating a second timing signal having a first controlled frequency correlated to the reference frequency, and phase synchronization pulses having the first frequency and a preset delay programmable with respect to the first timing signal.

28 Claims, 5 Drawing Sheets

DEVICE AND METHOD FOR GENERATING SYNCHRONOUS NUMERIC SIGNALS

BACKGROUND OF THE INVENTION

1. Field of the Invention

The present invention refers to a device and method for generating synchronous numeric signals.

2. Description of the Related Art

As is known, the use of numeric-type control systems is increasingly widespread in various fields. As compared to traditional purely analog control systems, in fact, numeric control systems are extremely versatile and are, moreover, very often simpler to design, less subject to failure, and less costly. In practice, in numeric control systems a microprocessor, or digital signal processor (DSP), receives, through an analog-to-digital converter, a measured signal correlated to a quantity to be controlled that is present in a system controlled and sampled at a preset control frequency. The measured signal is numerically processed to generate a control signal (having a frequency equal to the control frequency), which is supplied to an actuator for modifying the state of the controlled system and for keeping the quantity to be controlled close to a target value.

For numeric control systems to be efficient, it is, however, necessary to provide accurate analog-to-digital converters that convert with sufficient precision the signals supplied by the sensors and/or transducers that are present. In traditional A-D converters, the above aim is achieved by generating a plurality of reference voltages, the values whereof are normally determined by very precise resistive or capacitive ratios. On the other hand, the fabrication of resistive and capacitive components of controlled value ("matching") involves the use of sophisticated and costly processing steps to minimize the inevitable process-induced dispersions. In addition, all the resistive or capacitive components used for generating the reference voltages should respond in a homogeneous way to external stresses, for example thermal stresses.

To overcome the problems outlined above, A-D converters of sigma-delta type are in some cases preferred to traditional A-D converters. In fact, sigma-delta A-D converters have a very simple circuit structure and normally require a single reference voltage to be generated: their fabrication thus involves less complex and less costly processing steps and, in addition, sigma-delta converters are less sensitive to process-induced variations.

The use of these converters involves, however, a number of problems. It is, in fact, known that a sigma-delta converter receives an analog signal and outputs a sequence of bits that represent the sign of the variations of the analog signal at each operating cycle of the converter. To reconstruct a sample representing the value of the analog signal at a given instant, it is first of all necessary to oversample the analog signal, feeding the sigma-delta converter with a timing signal having a higher frequency than the control frequency. Then, by through a decimator, it is necessary to filter the bit sequence supplied by the sigma-delta converter and to select filtered samples, eliminating excess samples, so as to obtain a decimated signal having a decimation frequency equal to the required control frequency.

Normally, however, the decimation frequency is only approximately equal to the control frequency in that it is impossible to guarantee that the frequency of the timing signal will be exactly equal to an integer multiple of the sampling frequency. Consequently, it may occur that, in certain control cycles, no sample of the decimated signal will be supplied to the microprocessor, or else that, instead, a more recent sample will overwrite an older sample which has not yet been used by the microprocessor.

Figure 1A:
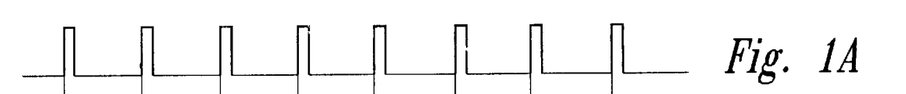
FIGS. 1a–e show plots versus time of quantities taken in a known control system.
Figure 1B:
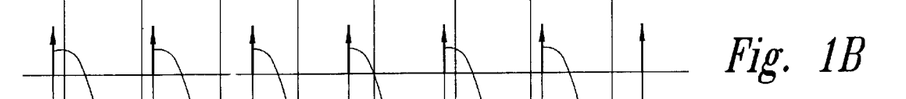
Figure 1C:
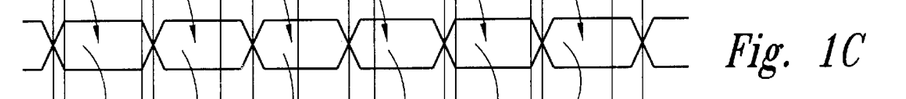
Figures 1D, 1E:
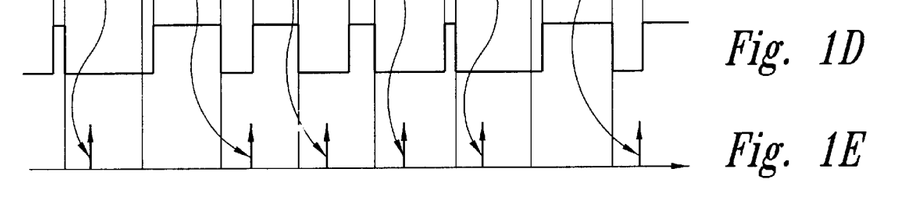

For more clarity, a condition with the decimation frequency lower than the control frequency is illustrated in FIGS. 1a–1e, which show: the plot of a timing signal synchronous with the control signal and activating control cycles (FIG. 1a); a sequence of decimation pulses (FIG. 1b); switchings of the decimated signal (FIG. 1c); the latency of the samples of the decimated signal, i.e., the time intervals between each decimation and when the selected sample is made available to the microprocessor (FIG. 1d); and the instants at which a new value of the control signal is supplied (FIG. 1e).

As may be noted, in some control cycles no sample is taken (i.e., no decimation pulses are present); consequently, in the immediately following control cycles, the microprocessor is not able to supply new values of the control signal, and wait cycles with no control action occur.

On the other hand, it is known that the recurrent presence of wait cycles, in which control actions cannot be performed, significantly degrades the performance of the control system. In addition, the phase delay of the decimated signal which is read by the microprocessor and affects the stability of the control system is variable and unpredictable, in so far as the latency of the samples is variable.

Alternatively, it is possible to carry out a frequency conversion before the data generated are read by the microprocessor. In this case, the sequence of samples supplied by the sigma-delta converter is initially filtered with a reconstructing filter to generate a sequence of reconstructed samples, and is then expanded, inserting between two successive samples a first preset integer L of zero samples corresponding to instants comprised in a same sampling interval. The expanded sequence of data is then filtered through a low-pass filter so as to replace the zero samples with interpolated samples. Next, a decimation of the expanded sequence of data is performed, keeping one sample every M samples (M being a second pre-set integer) and eliminating all the others. By choosing the numbers L and M in such a way that the following condition is satisfied:

$$F_C = \frac{L+1}{M} F_s$$

where $F_C$ is the control frequency and $F_S$ is the frequency of the sequence of reconstructed samples, the decimated sequence of data has a frequency equal to the control frequency $F_C$ and may thus be used to generate the control signal.

However, also the frequency conversion causes a phase delay, and hence adversely affects the stability of the control system. Furthermore, frequency conversion is performed using microprograms (firmware), and this entails both problems of bulk in so far as it is necessary to provide nonvolatile memories, and an increase in the required processing power.

From the above, it is evident that the use of sigma-delta converters that are not properly synchronized involves even serious difficulties. In particular, the stability of the control systems may be impaired.

The aim of the present invention is to overcome the drawbacks of known devices and, in particular, to generate a numeric signal synchronized in frequency and in phase with a reference numeric signal.

SUMMARY OF THE INVENTION

According to one aspect of the present invention there is provided a device for generating synchronous numeric signals, comprising: reference generating means supplying a reference signal and a first timing signal, both having a reference frequency; timed generating means supplying a synchronized signal having said reference frequency; and synchronization means generating a second timing signal having a first controlled frequency correlated to said reference frequency, and phase synchronization pulses having said reference frequency and a preset delay programmable with respect to said first timing signal.

Another aspect of the invention provides a method for generating synchronous numeric signals, comprising the steps of: generating a reference signal and a first timing signal, both having a reference frequency; and generating, from said first timing signal, a second timing signal having a first controlled frequency correlated to said reference frequency, and phase synchronization pulses having said reference frequency and a preset delay programmable with respect to said first timing signal.

For a better understanding of the present invention, a preferred embodiment thereof is now described, purely as a non-limiting example, with reference to the attached drawings.

DETAILED DESCRIPTION OF THE INVENTION

In the first described embodiment, the invention is applied to a R/W device for hard disks.

Figure 2:
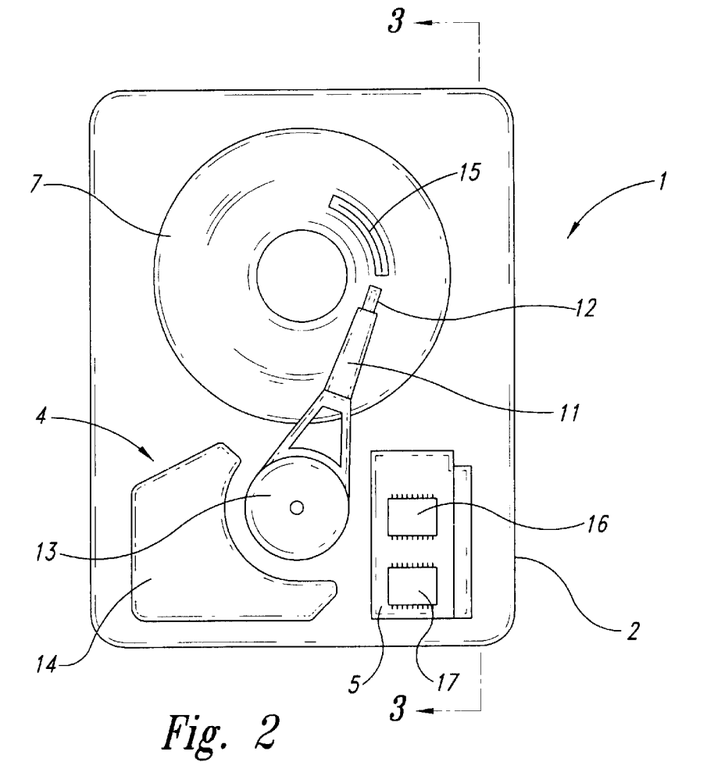
FIG. 2 is a simplified top plan view of a R/W system for a hard disk.
Figure 3:
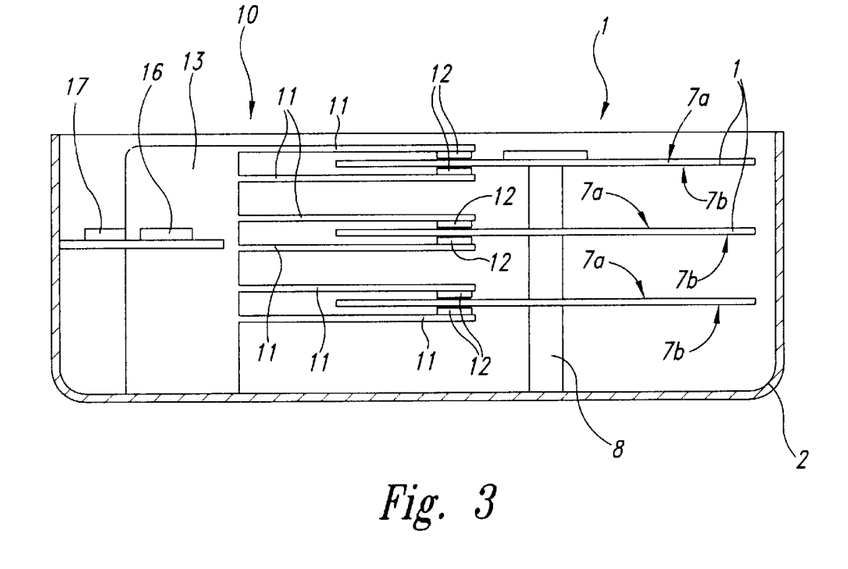
FIG. 3 is a side view of the device of FIG. 2, in a section taken along plane 3—3.

With reference to FIGS. 2 and 3, an R/W device 1 for hard disks is housed inside a casing 2 and comprises a plurality of magnetic disks 7, a head-actuator assembly 4, and a control card 5.

The magnetic disks 7 are mounted coaxially and rotationally integral to a shaft 8 of a motor (not shown) and have each a top surface 7a and a bottom surface 7b. In addition, control information is stored, in a per se known manner, in preset sectors of the magnetic disks 7.

The head-actuator assembly 4 comprises a rotating support 13 (generally referred to as E-block on account of its shape), a plurality of suspension arms 11, integrally connected to the rotating support 13, and a plurality of R/W heads 12 carried by respective suspension arms 11; in use, each head 12 faces a respective surface 7a, 7b of the magnetic disks 7, for reading and writing. A motor 14 is connected to and drives the rotating support 13 for positioning the R/W heads 12 on a desired data track 15.

The control card 5 is carried by the casing 2 and comprises a control unit 16 and a sensor assembly 17. In addition, the control card 5 is connected to the motor 14 through a connector of a known type (not shown).

Figure 4:
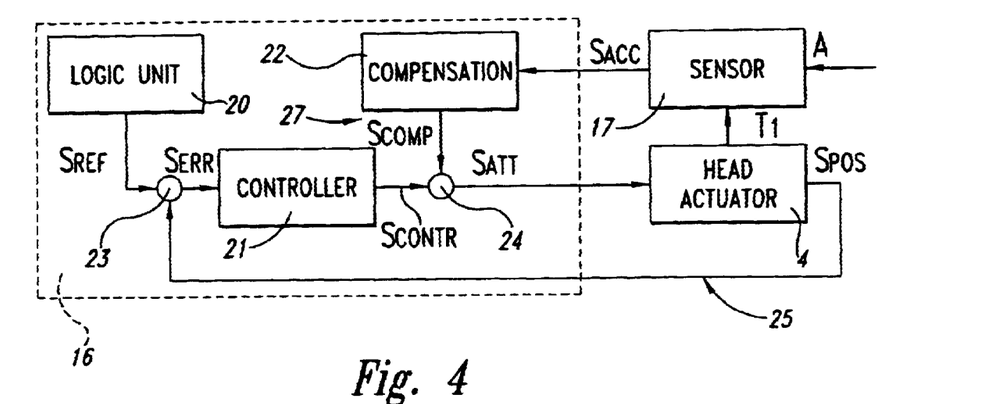
FIG. 4 is a simplified block diagram of a noise compensating device according to the present invention.

As illustrated in FIG. 4, the control unit 16 comprises a logic unit 20, a controller 21, a compensation block 22, a subtracting node 23, and an adding node 24.

The logic unit 20 generates, in a known way, a reference signal $S_{REF}$ indicative of a target position for the read heads 12. The subtracting node 23 receives the reference signal $S_{REF}$, as well as a position signal $S_{POS}$ fed on a first output of the head-actuator assembly 4, in a known way. The output of the subtracting node 23 is connected to an input of the controller 21. The controller 21 has an output connected to the adding node 24 and supplying a control signal $S_{CONTR}$. The head-actuator assembly 4 has an input connected to the adding node 24 and a second output connected to the sensor assembly 17 and supplying a first timing signal $T_1$. The control signal $S_{CONTR}$ and the first timing signal $T_1$ have a first frequency $F_1$ determined by the rotation rate of the disks 7 and by the number of control sectors. For instance, in a disk having an angular speed of 5400 rpm and 60 control sectors, the first frequency $F_1$ is 5400 Hz.

The sensor assembly 17, which will be described in detail later on with reference to FIG. 5 and is preferably made as a single integrated device, has an output connected to an input of the compensation block 22. In addition, the sensor assembly 17 supplies, on its output, an acceleration signal $S_{ACC}$ synchronized with the control signal $S_{CONTR}$ and representative of an acceleration A due to noise forces, such as mechanical vibrations, acting on the R/W device 1. The compensation block 22 has an output connected to the adding node 24 and supplying a compensation signal $S_{COMP}$.

In this way, the sensor assembly 17 and the compensation block 22 form an open loop compensation line 27. Furthermore, the controller 21, the head-actuator assembly 4, the subtracting node 23 and adding node 24 form a control loop 25.

The position signal $S_{POS}$ supplied by the head-actuator assembly 4 is representative of the distance of the read heads 12 from a center-of-track position and is generated when the read heads 12 fly on the sectors of the magnetic disks 7 storing the control information. In particular, the signal $S_{POS}$ is obtained, in a known way, by sampling an analog signal at the first frequency $F_1$. The error signal $S_{ERR}$ and the control signal $S_{CONTR}$ generated within the control loop 25 are synchronous with the position signal $S_{POS}$, and hence have the first frequency $F_1$.

The subtracting node 23 subtracts the position signal $S_{POS}$ from the reference signal $S_{REF}$ and generates an error signal $S_{ERR}$. The error signal $S_{ERR}$ is then used in the controller 21 to obtain the control signal $S_{CONTR}$, using any known control technique (for example, a PID control technique).

The adding node 24 receives the control signal $S_{CONTR}$ and the compensation signal $S_{COMP}$ (synchronized to each other) and adds them, to generate an actuation signal $S_{ATT}$ supplied to the head-actuator assembly 4 to correct the position of the read heads 12.

Figure 5:
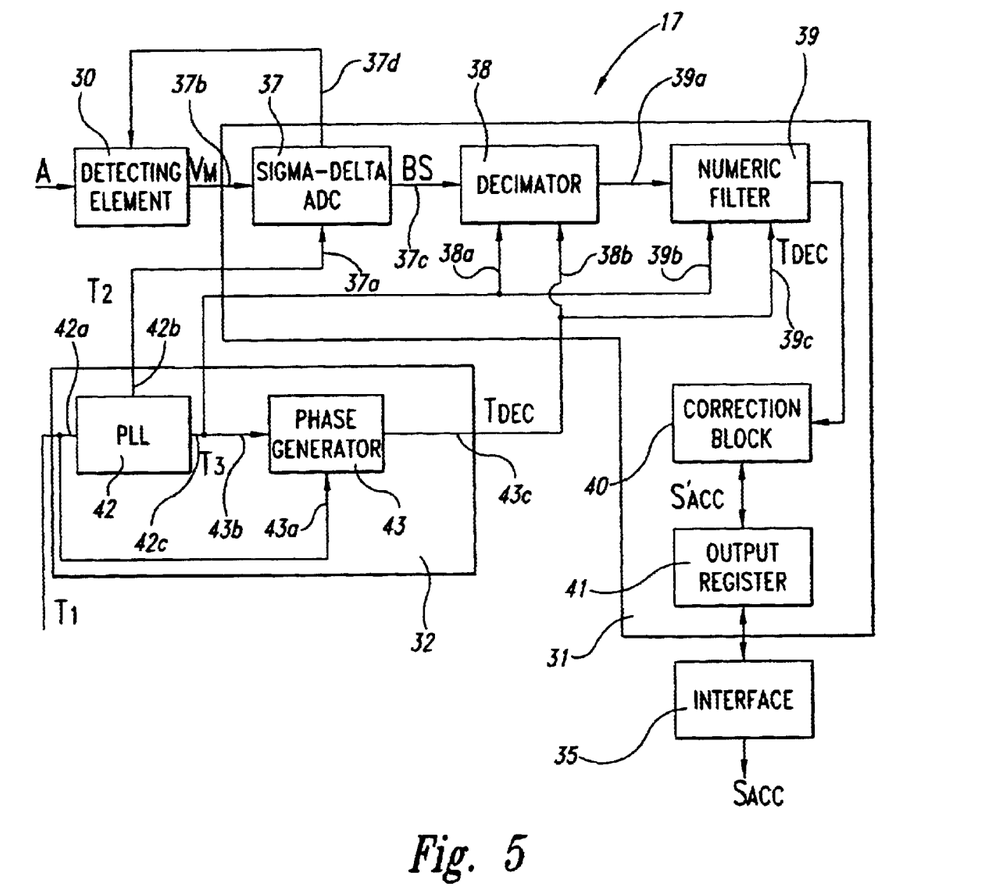
FIG. 5 is a more detailed block diagram of one part of the diagram of FIG. 4, including a synchronization device according to a first embodiment of the present invention.

With reference to FIG. 5, the structure of the sensor assembly 17 is now described, the output signal whereof (acceleration signal $S_{ACC}$) is synchronized with the control signal $S_{CONTR}$.

The sensor assembly 17 comprises a sensing element 30, an acquisition stage 31, a synchronization stage 32, and an interface circuit 35.

The sensing element 30, preferably an acceleration sensor of the rotational type, made using the MEMS (Micro-Electro-Mechanical Systems) technology, detects the rotational component of the acceleration A acting onto the R/W device 1, for example on account of mechanical vibrations, and has an output supplying a measure analog signal $V_M$ correlated to the acceleration A.

The acquisition stage 31 is connected between the sensing element 30 and the interface 35, and comprises an analog-to-digital converter 37, preferably of the sigma-delta type, a decimator 38, a numeric filter 39, a correction block 40, and an output register 41, cascade-connected together. In addition, the A/D converter 37 has a control output 37d connected to a control input of the sensing element 30. Thereby, the sensing element 30 and the A/D converter 37 form an acquisition loop of the sigma-delta type, in itself known and described, for example, in M. Lemkin and B. Boser, "A Three Axis Micromachined Accelerometer with a CMOS Position-Sense Interface and Digital Offset-Trim Electronics," IEEE Journal of Solid State Circuits, Vol. 34, No. 4.

The synchronization stage 32 comprises a phase locked loop (PLL) 42 and a phase generator circuit 43. The PLL 42 has an input 42a receiving the first timing signal $T_1$, a first output 42b connected to a first input 37a of the A/D converter 37 and supplying a second timing signal $T_2$, and a second output 42c connected to the timing input 38a of the decimator 38 and to a timing input 39b of the numeric filter 39 and supplying a third timing signal $T_3$. In the PLL 42, the second timing signal $T_2$ and the third timing signal $T_3$ are generated as described below, starting from the first timing signal $T_1$.

The phase generator circuit 43 has inputs 43a and 43b receiving the first timing signal $T_1$ and, respectively, the third timing signal $T_3$, and an output 43c connected to a decimation input 38b of the decimator 38 and to an activation input 39c of the numeric filter 39. The output 43c of the phase generator circuit 43 supplies decimation pulses $T_{DEC}$ at the first frequency $F_1$ and with a preset delay with respect to the first timing signal $T_1$.

The second timing signal $T_2$ has a second frequency $F_2$ not lower than the first frequency $F_1$, and the third timing signal $T_3$ has a third frequency $F_3$ comprised between the second frequency $F_2$ and the first frequency $F_1$. In particular, the following relationship apply: $F_2=M*F_1$, and $F_3=N*F_1$, where M and N are two integers, with $M \geq N$ (for example, M=224 and N=32). Consequently, since $F_2=(M/N)*F_3$, the second frequency $F_2$ is greater than or equal to the third frequency $F_3$. In addition, the decimation pulses $T_{DEC}$ have the first frequency $F_1$ of the control signal $S_{CONTR}$.

During operation of the R/W device 1, the PLL 42 locks to the first timing signal $T_1$ of the control loop 25 and generates the second timing signal $T_2$ and the third timing signal $T_3$. In turn, the phase generator circuit 43 generates decimation pulses $T_{DEC}$ with a preset delay K with respect to the edges of the first timing signal $T_1$. The delay K is representative of the sample to be selected by the decimator 38.

The A/D converter 37, preferably of the sigma-delta type, receives, on a second input 37b, the analog measure signal $V_M$ and, using the second timing signal $T_2$ as internal timing signal, issues, on an output 37c, a sampled signal BS formed by a flow of bits oversampled with respect to the first frequency $F_1$. In particular, since the A/D converter 37 is of the sigma-delta type, the individual bits of the sampled signal BS are produced by the A/D converter 37 at the third frequency $F_3$.

Figure 6:
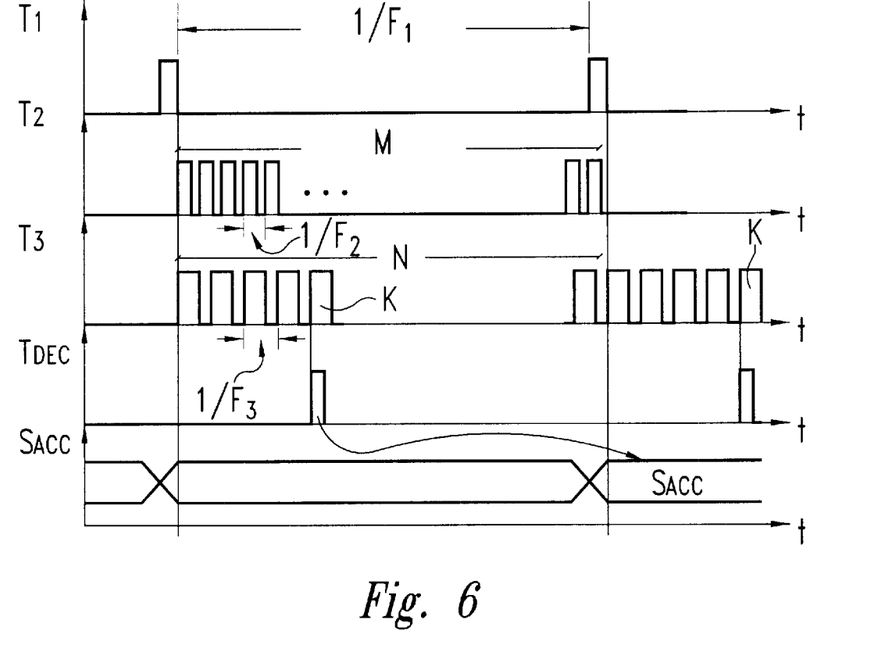
FIG. 6 shows the plot of quantities taken in the device of FIGS. 4 and 5.

In a per se known manner, the decimator 38 filters the sampled signal BS received from the A/D converter 37 in order to reconstruct an oversampled numeric signal, wherein every sample includes a preset number of bits, and in order to eliminate any high frequency components introduced by the analog measure signal $V_M$. Indeed, if these component are not eliminated, decimation would cause a spectrum folding that, as known, causes distortions. In addition, at each decimation pulse $T_{DEC}$, the decimator 38 selects and supplies a sample to a data input 39a of the numeric filter 39, while the other samples are eliminated. For example, at each cycle, the K-th sample following the rising edge of the first timing signal $T_1$ is selected, as illustrated in FIG. 6, where the delay K is an integer number comprised between 0 and N-1. Since a decimation pulse $T_{DEC}$ is generated at each cycle of the first timing signal $T_1$, the decimator 38 outputs samples that have the same frequency $F_1$ as the first timing signal $T_1$ of the control loop 25.

The numeric filter 39, which is preferably a second order self-regression filter (or infinite impulse response IIR filter) of a known type, filters the data received from the decimator 38 to eliminate the high frequency noise components and carry out a phase equalization in the frequency band of interest (for example, from 0 Hz to 800 Hz). This enables the phase delay introduced by the decimator 38 to be compensated and reduced to the minimum.

The correction block 40 compensates the offsets and the gain losses introduced by the acquisition stage 31 by adding an offset term to the samples received and, respectively, by multiplying the samples by a preset gain factor.

The signal at the output of the correction block 40 is the acceleration signal $S'_{ACC}$, which is stored in the FIFO type output register 41 to be read preferably in an immediately successive cycle of the first timing signal $T_1$. In practice, each sample of the acceleration signal $S_{ACC}$ is representative of the acceleration detected by the sensing element 30 during the cycle that precedes the first timing signal $T_1$ and is made available through the interface 35 to be used by the compensation block 22 from the start of a cycle that immediately follows (as represented by the arrow in FIG. 6). In addition, thanks to the use of the timing signals $T_2$, $T_3$ and the decimation pulses, respectively generated by the PLL 42 and by the phase generator circuit 43 starting from the first timing signal $T_1$, the acceleration signal $S_{ACC}$ has the first frequency $F_1$ and is therefore synchronous with the signals present in the control loop 25 (in particular, it is synchronous with the control signal $S_{CONTR}$).

Figure 7:
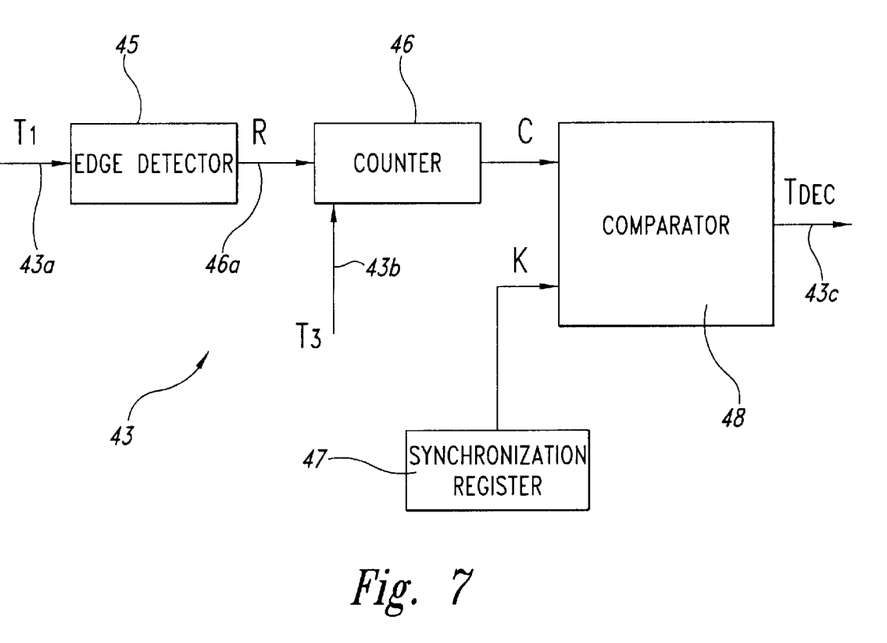
FIG. 7 is a more detailed block diagram of one part of the diagram of FIG. 5.

As shown in FIG. 7, the phase generator circuit 43 comprises an edge detector 45, a counter 46, a synchronization register 47, and a comparator 48.

The edge detector 45 is connected to the first input 43a of the phase generator circuit 43 (fed with the first timing signal $T_1$) and supplies reset pulses R at rising edges of the first timing signal $T_1$. The counter 46 has a reset input 46a receiving the reset pulses R, is connected to the second input 43b of the phase generator circuit 43 (fed with the third timing signal $T_3$) and has an output supplying a counting signal C which is incremented at each cycle of the third timing signal $T_3$ and hence has the third frequency $F_3$.

The comparator 48 has a first input connected to the output of the counter 46, and a second input connected to an output of the synchronization register 47, which supplies the delay K. When the counting signal C is equal to the delay K, an output 43c of the comparator 48 switches, supplying a decimation pulse $T_{DEC}$. Preferably, the delay K may be programmed by writing the synchronization register 47.

Consequently, the present noise compensating device generates a sampled signal BS having a frequency correlated to the signals present in the control loop 25. Thereby, an acceleration signal $S_{ACC}$ may be generated, which represents accelerations due to disturbance forces acting on the R/W device 1 and is synchronous with the control signal $S_{CONTR}$, without the need of sampling frequency conversions. Moreover, the samples of the acceleration signal $S_{ACC}$ may be generated immediately before being used by the compensation block 22. As a consequence, the phase of the compensation signal $S_{COMP}$ is not degraded. Rather, the use of the numeric filter 39 to perform an equalization, enables minimization of the phase delay, and thus ensures a high effectiveness of the open loop noise compensation.

Synchronization is moreover performed using a hardware circuit instead of a firmware procedure. The design phase is thus simplified, and it is possible to reduce both the size of the nonvolatile memory storing the firmware and the required processing power.

In addition, the numeric filter 39 eliminates any noise outside of the frequency band, and in particular high frequency noise. Furthermore, the fact that the sensor assembly 17 is implemented by a single integrated device means that the noise affecting the acceleration signal $S_{ACC}$ is very contained.

Figure 8:
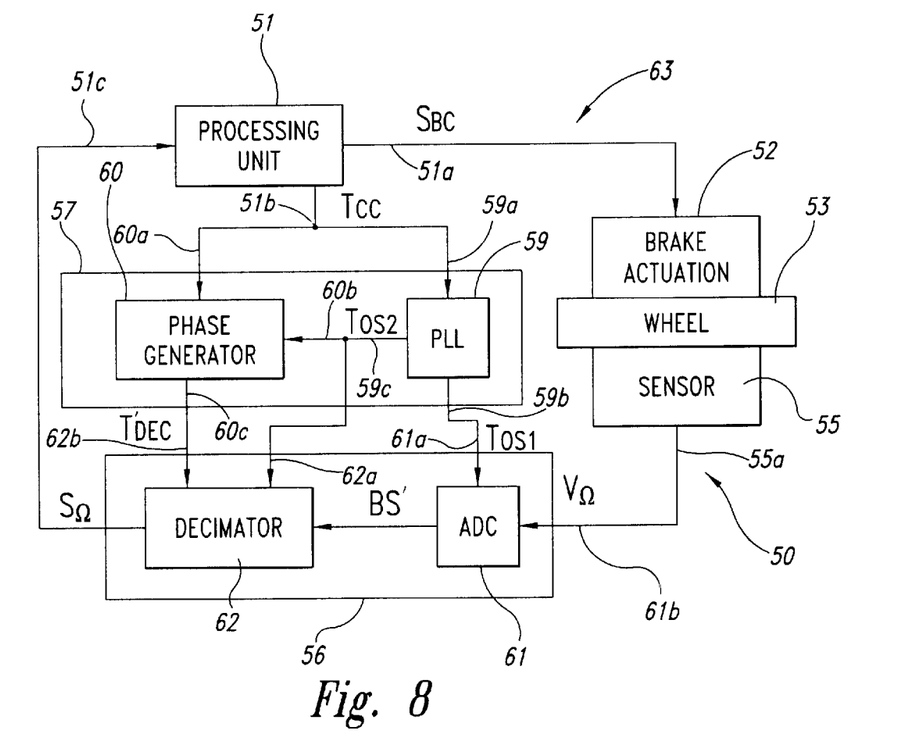
FIG. 8 shows a control system including a synchronization device according to a second embodiment of the present invention.

A second embodiment, hereinafter described with reference to FIG. 8, regards a braking control system 50 for motor vehicles, in particular of the type commonly referred to as anti-lock braking system (ABS—from the German "AntiBlockierSystem").

The braking control system 50 comprises a control unit 51, connected to a brake-operating device 52 for a wheel 53, an angular-velocity sensor 55, an acquisition stage 56, and a synchronization stage 57 identical to the synchronization stage 32 illustrated in FIGS. 5 and 7. In particular, the synchronization stage 57 comprises a phase-locked loop (PLL) 59 and a phase-generating circuit 60. Preferably, the control unit 51 carries out separate and independent control of each wheel of the vehicle on which the braking control system 50 is mounted. For reasons of simplicity, in FIG. 8 the components corresponding to the braking control of a single wheel 53 are illustrated.

The control unit 51, which operates at an internal frequency, for example 5 MHz, has a first output 51a connected to an input of the brake-operating device 52 and supplying a brake control signal $S_{BC}$, and a second output, connected to an input 59a of the PLL 59 and to an input 60a of the phase-generating circuit 60. The second output 51b of the control unit 51 supplies a timing control signal $T_{CC}$ which has a control frequency $F_{CC}$ equal to the frequency of the brake control signal $S_{BC}$.

The angular-velocity sensor 55, for example a dynamo driven by the wheel 53, has an output 55a supplying an analog angular-velocity signal $V_\Omega$, representative of the angular velocity of the wheel 53.

The acquisition stage 56 is connected between the output 55a of the angular-velocity sensor 55 and an input 51c of the processing unit 51, and comprises a sigma-delta converter 61 and a decimator 62, cascade-connected. In particular, the acquisition stage 56 supplies, to the processing unit 51, a numeric angular-velocity signal $S_\Omega$, obtained from the analog angular-velocity signal $V_\Omega$. In addition, the control unit 51, the brake-operating device 52, the sensor 54, and the acquisition stage 56 form a control loop 63.

If the numeric angular-velocity signal $S_\Omega$ decreases rapidly and approaches zero, the processing unit 51 detects locking of the wheel 53 and, in a per se known manner, acts on the brake-operating device 52 through the brake control signal $S_{BC}$, so as to restore an optimal adherence of the wheel 53.

The PLL 59 has an input 59a receiving the timing control signal $T_{CC}$, a first output 59b, connected to a first input 61a of the A-D converter 61 and supplying a first oversampling signal $T_{OS1}$, and a second output 59c, connected to a timing input 62a of the decimator 62 and supplies a second oversampling signal $T_{OS2}$.

During operation of the braking-control system 50, the PLL 59 locks to the timing control signal $T_{CC}$ of the control loop 63 and generates the first oversampling signal $T_{OS1}$ and the second oversampling signal $T_{OS2}$. These signals have, respectively, a first oversampling frequency $F_{OS1}$ and a second oversampling frequency $F_{OS2}$, equal to respective integer multiples of the control frequency $F_{CC}$ of the timing control signal $T_{CC}$ and of the brake control signal $S_{BC}$. In addition, the first oversampling frequency $F_{OS1}$ and the second oversampling frequency $F_{OS2}$ may be equal to one another if the sigma-delta converter is able to output a new bit for each cycle of the first oversampling signal $T_{OS1}$; otherwise, the first oversampling frequency $F_{OS1}$ is higher than the second oversampling frequency $F_{OS2}$.

The phase-generating circuit 60 has a first input 60a and a second input 60b which respectively receive the timing control signal $T_{CC}$ and the second oversampling signal $T_{OS2}$, and an output 60c, connected to a decimation input 62b of the decimator 62. The output 60c of the phase-generating circuit 60 supplies decimation pulses $T_{DEC}'$ having a control frequency $F_{CC}$ and a delay K' which is preset and constant with respect to the timing control signal $T_{CC}$. The delay K' indicates the signal to be selected by the decimator 62.

The sigma-delta converter 61 receives, on a second input 59b, the analog angular-velocity signal $V_\Omega$ and, using the first oversampling signal $T_{OS1}$ as an internal timing signal, supplies, on an output 59c, a sampled signal BS' made up of a bit stream having the second oversampling frequency $F_{OS2}$.

In practice, the brake control signal $S_{BC}$ works as a reference signal, and the control frequency $F_{CC}$ is used as a reference frequency. The PLL 59, in fact, locks to the timing control signal $T_{CC}$, generated by the processing unit 51 synchronously with the brake control signal $S_{BC}$. Thereby, the PLL 59 detects the control frequency $F_{CC}$ and generates the oversampling signals $T_{OS1}$, $T_{OS2}$ with the respective oversampling frequencies $F_{OS1}$, $F_{OS2}$. These signals are then used to time the sigma-delta converter 61 and the decimator 62, as well as to generate the decimation pulses $T_{DEC}'$ with a delay K' with respect to the timing control signal $T_{CC}$.

Figure 9:
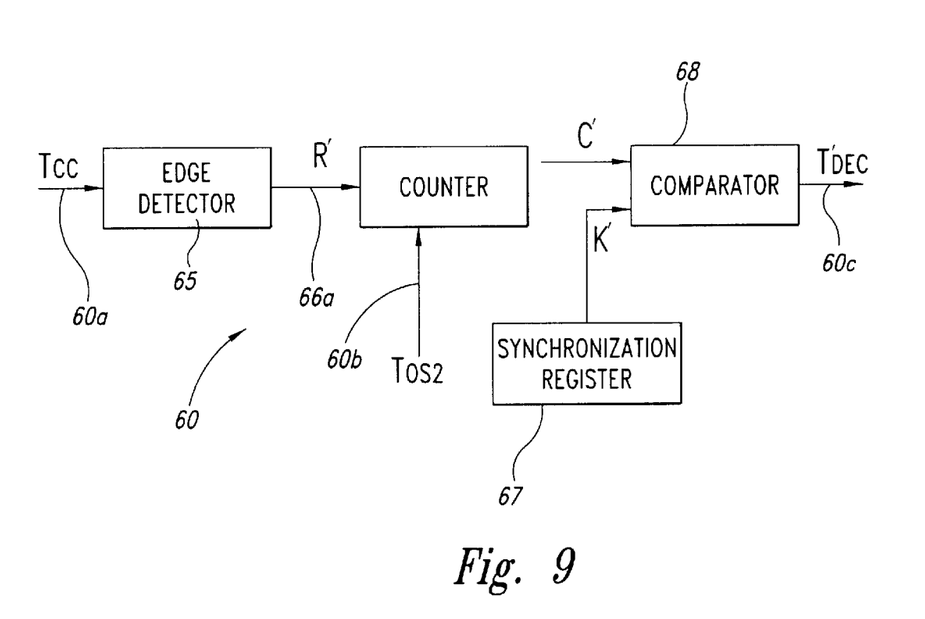
FIG. 9 is a more detailed block diagram of a part of the diagram of FIG. 8.

As shown in FIG. 9, the phase generating circuit 60 comprises an edge detector 65, a counter 66, a synchronization register 67, and a comparator 68.

The edge detector 65 is connected to the first input 60a of the phase generator 60 (receiving the timing control signal $T_{CC}$) and outputs reset pulses R' upon detection of rising edges of the first timing control signal $T_{CC}$. The counter 66 has a reset input 66a receiving the reset pulses R', is connected to the second input 60b of the phase generator 60 (receiving the second oversampling signal $T_{OS2}$), and has an output supplying a counting signal C' which is incremented at each cycle of the second oversampling signal $T_{OS2}$.

Figure 10:
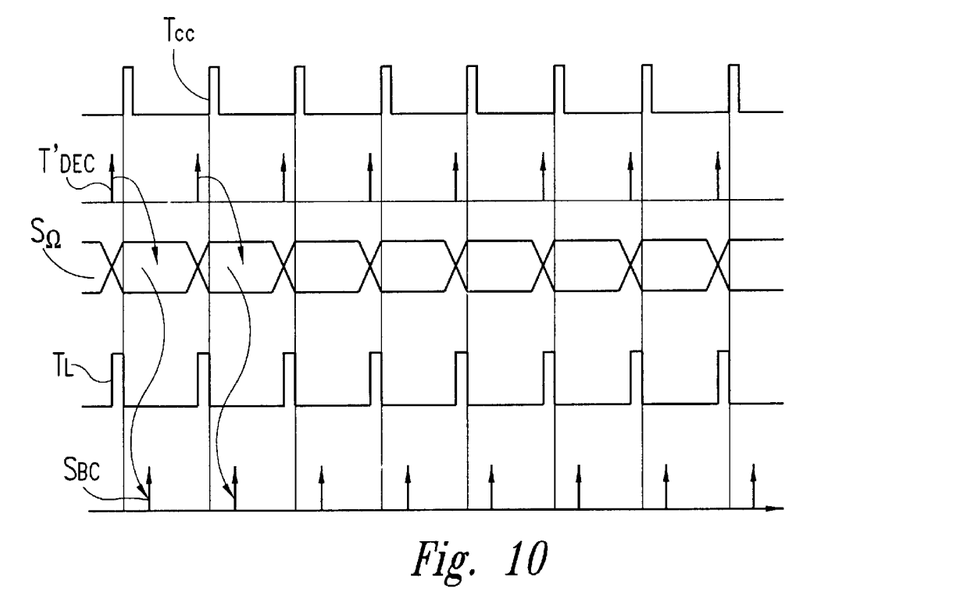
FIG. 10 shows the plot of quantities taken in the device according to FIGS. 8 and 9.

The comparator 68 has a first input connected to the output of the counter 66 and a second input connected to an output of the synchronization register 67 which supplies the delay K'. When the counting signal C' is equal to the delay K', the output of the comparator 68 switches, supplying a decimation pulse $T_{DEC}'$. Consequently, at each cycle of the timing control signal $T_{CC}$, exactly one decimation pulse $T_{DEC}'$ is generated having a preset and constant delay K' from the respective edge of the timing control signal $T_{CC}$, as illustrated in FIG. 10. Preferably, the delay K' is programmable by writing the synchronization register 67. Thereby, the latency $T_L$ of the selected samples (FIG. 8), i.e., the time interval that elapses between a decimation pulse $T_{DEC}'$ and the instant when the selected sample becomes usable by the processing unit 51, is reduced to a minimum. Consequently, also the phase margin of the braking-control system 50 is constant and may be optimized.

From the above, it is clear that the invention enables an advantageous utilization of sigma-delta converters also in closed-loop control systems, avoiding any degradation of the phase margin and any impairment of stability, since the invention carries out a high-precision, frequency and phase synchronization of two signals of numeric type, one of which is generated by a sigma-delta converter.

More in general, the invention may be applied in all cases where it is necessary to generate a numeric signal that is synchronized both in frequency and in phase with a reference numeric signal.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A device for generating synchronous numeric signals, comprising:

reference generating means supplying a reference signal and a first timing signal, both having a reference frequency;

timed generating means supplying a synchronized signal having said reference frequency; and synchronization means generating a second timing signal having a first controlled frequency correlated to said reference frequency, and phase synchronization pulses having said reference frequency and a preset delay programmable with respect to said first timing signal.

2. The device of claim 1 wherein said timed generating means comprise:

sampling means receiving an analog signal and supplying a sampled signal having a second controlled frequency correlated to said reference frequency; and a decimating stage receiving said sampled signal and said phase synchronization pulses and generating said synchronized signal having said reference frequency.

3. The device of claim 2 wherein said synchronization means comprise:

frequency generating means receiving said first timing signal and supplying said second timing signal and a third timing signal having said second controlled frequency; and phase generating means receiving said first timing signal and said third timing signal, and having an output connected to said decimating stage and supplying said synchronization pulses.

4. The device of claim 3 wherein said first controlled frequency and said second controlled frequency are integer multiples of said reference frequency.

5. The device of claim 3 wherein said sampling means have a timing input, and in that said frequency generating means have a frequency sensing input receiving said first timing signal, and a first output connected to said timing input and supplying said second timing signal.

6. The device of claim 3 wherein said decimating stage comprises a decimator circuit having a timing input connected to a second output of said frequency generating means and receiving said third timing signal, and a decimation input connected to said output of said phase generating means and receiving said synchronization pulses.

7. The device of claim 3 wherein said frequency-generating means comprise a phase-locked loop.

8. The device of claim 3 wherein said phase-generating means comprise:

counter means having a counting input receiving said third timing signal, a reset input, and an output supplying a counting signal which has said second controlled frequency; and reset means having an input and an output, said input of said reset means receiving said first timing signal, and said output being connected to said reset input of said counter means and supplying reset pulses at preset switching edges of said first timing signal.

9. The device of claim 8 wherein said phase generating means further comprise comparator means and memory means, said memory means having an output supplying said delay, and said comparator means having a first input connected to said output of said counter means, a second input connected to said output of said memory means, and an output supplying said synchronization pulses when said counting signal and said delay signal are equal.

10. The device of claim 9 wherein said delay is programmable by writing said memory means.

11. The device of claim 1 wherein said sampling means comprise a sigma-delta converter.

12. A method for generating synchronous numeric signals, comprising:

generating a reference signal and a first timing signal, both having a reference frequency; and generating, from said first timing signal, a second timing signal having a first controlled frequency correlated to said reference frequency, and phase synchronization pulses having said reference frequency and a preset delay programmable with respect to said first timing signal.

13. The method of claim 12, further comprising:

sampling an analog signal, using said second timing signal, to generate a sampled signal having a second controlled frequency correlated to said reference frequency;

generating a third timing signal having said second controlled frequency; and decimating said sampled signal using said third timing signal and said phase synchronization pulses to generate a synchronized signal having said reference frequency.

14. The method of claim 13 wherein said first controlled frequency and said second controlled frequency are integer multiples of said reference frequency.

15. The method of claim 13 wherein said sampling step comprises performing an analog-to-digital conversion, and in that said decimation step comprises the step of selecting, for each cycle of said first timing signal, a sample having said delay with respect to preset switching edges of said first timing signal.

16. The method of claim 15 wherein said step of performing an analog-to-digital conversion is carried out by using a sigma-delta converter timed with said second timing signal.

17. The method of claim 12, further comprising the step of programming said delay.

18. A device for generating synchronous numeric signals, comprising:
- a reference generator operable to supply a reference signal and a first timing signal, both having a reference frequency;
- a timed synchronized signal generator operable to supply a synchronous signal having said reference frequency; and
- synchronization circuitry operable to generate a second timing signal having a first controlled frequency correlated to said reference frequency and phased synchronization pulses having said reference frequency and a preset delay programmable with respect to said first timing signal.

19. The device of claim 18 wherein the timed synchronized generator comprises:
- an analog to digital converter (ADC) to receive an analog signal and supply a digital sampled signal having a second controlled frequency correlated to the reference frequency; and
- a decimating stage receiving the sampled signal and the phase synchronization pulses and generating the synchronized signal having the reference frequency.

20. The device of claim 19 wherein the ADC is a sigma-delta converter.

21. The device of claim 19 wherein the first controlled frequency and the second controlled frequency are integer multiples of the reference frequency.

22. The device of claim 21 wherein the frequency generator comprises a phase-locked loop.

23. The device of claim 19 wherein the synchronization circuitry comprises:
- a frequency generator configured to receive the first timing signal and supply the second timing signal and a third timing signal having the second controlled frequency; and
- a phase generator configured to receive the first and third timing signals, and having an output connected to the decimating stage to supply the synchronization pulses thereto.

24. The device of claim 23 wherein the decimating stage comprises a decimator circuit having a timing input connected to a second output of the frequency generator and receiving the third timing signal therefrom, and a decimation input connected to the phase generator and receiving the synchronization pulses therefrom.

25. The device of claim 23 wherein the frequency generator includes a frequency sensing input to receive the first timing signal and a first output connected to a timing input on the converter and supplying the second timing signal thereto.

26. The device of claim 23 wherein the phase generator comprises:
- a counter having a counting input configured to receive the third timing signal, a reset input, and an output configured to supply a counting signal having the second controlled frequency; and
- a reset circuit having an input and an output, the reset circuit input being configured to receive the first timing signal, and the reset circuit output being connected to the counter reset input, the reset circuit supplying reset pulses at predetermined switching edges of the first timing signal.

27. The device of claim 26 wherein the phase generator comprises a memory circuit to supply the delay and a comparator having a first input connected to the output of the counter, a second input connected to the memory to receive the delay therefrom, and an output to supply the synchronization pulses when the counter signal and the delay signal are equal.

28. The device of claim 27 wherein the delay signal is programmable by writing a delay value into the memory circuit.

* * * * *